(12) United States Patent
Choi et al.

(10) Patent No.: US 6,656,792 B2
(45) Date of Patent: Dec. 2, 2003

(54) NANOCRYSTAL FLASH MEMORY DEVICE AND MANUFACTURING METHOD THEREFOR

(75) Inventors: Wee Kiong Choi, Singapore (SG); Wai Kin Chim, Singapore (SG); Vivian Ng, Singapore (SG); Lap Chan, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 10/087,506

(22) Filed: Mar. 1, 2002

(65) Prior Publication Data
US 2003/0077863 A1 Apr. 24, 2003

Related U.S. Application Data
(60) Provisional application No. 60/348,072, filed on Oct. 19, 2001.

(51) Int. Cl.$^7$ ............................................. H01L 21/336
(52) U.S. Cl. ....................................... 438/257; 257/315
(58) Field of Search .............................. 438/257, 264, 438/275, 591; 257/315

(56) References Cited

U.S. PATENT DOCUMENTS 5,943,571 A * 8/1999 Schaefer et al. ............. 438/257
6,054,349 A * 4/2000 Nakajima et al. ........... 438/257
6,165,842 A * 12/2000 Shin et al. .................. 438/257
6,208,000 B1 * 3/2001 Tanamoto et al. ........... 257/402
6,320,784 B1 * 11/2001 Muralidhar et al. ......... 365/151

OTHER PUBLICATIONS

Ya–Chin King, Tsu–Jae King, and Chenming Hu, "MOS Memory Using Germanium Nanocrystals Formed by Thermal Oxidation of $Si_{1-x}Ge_x$", IEDM, 1998, pp. 115–118.

Sandip Tiwari, Farhan Rana, Hussein Hanafi, Allan Hartstein, Emmanuel F. Crabbe, and Kevin Chan, "A silicon nanocrystals based memory", Appl Phys. Lett. 68 (10) 4, Mar. 1996, pp. 1377–1379.

* cited by examiner

Primary Examiner—David Nelms
Assistant Examiner—Quoc Hoang
(74) Attorney, Agent, or Firm—Mikio Ishimaru

(57) ABSTRACT

A Flash memory is provided having a trilayer structure of rapid thermal oxide/germanium (Ge) nanocrystals in silicon dioxide ($SiO_2$)/sputtered $SiO_2$ cap with demonstrated via capacitance versus voltage (C-V) measurements having memory hysteresis due to Ge nanocrystals in the middle layer of the trilayer structure. The Ge nanocrystals are synthesized by rapid thermal annealing of a co-sputtered $Ge+SiO_2$ layer.

32 Claims, 3 Drawing Sheets

NANOCRYSTAL FLASH MEMORY DEVICE AND MANUFACTURING METHOD THEREFOR

CROSS-REFERENCE TO RELATED APPLICATION

This application claims the benefit of U.S. Provisional patent application serial No. 60/348,072 filed Oct. 19, 2001, and is herein incorporated by reference.

BACKGROUND

1. Technical Field

The present invention relates generally to Flash memory devices and more particularly to Flash memory devices using nanoncrystals.

2. Background Art

The increasing use of portable electronics and embedded systems has resulted in a need for low-power high-density non-volatile memories that can be programmed at very high speeds. One type of memory, which has been developed, is Flash electrically erasable programmable read only memory (Flash EEPROM). It is used in many portable electronic products, such as personal computers, cell phones, portable computers, voice recorders, etc. as well as in many larger electronic systems, such as cars, planes, industrial control systems, etc.

A Flash EEPROM device is formed on a semiconductor substrate. In portions of the surface of the substrate, a doped source region and a doped drain region are formed with a channel region therebetween. A tunnel silicon oxide dielectric layer is formed on the semiconductor substrate over the channel region and between the source and drain regions. Above the tunnel silicon oxide dielectric layer, over the channel region, a stacked-gate structure is formed for a transistor having a floating gate layer, an inter-electrode dielectric layer, and a control gate layer. The source region is located on one side of the stacked gate structure with one edge of the source region overlapping the gate structure. The drain region is located on the other side of the stacked gate structure with one edge overlapping the gate structure. The device is programmed by hot electron injection and erased by Fowler-Nordheim tunnelling.

A silicon (Si) nanocrystal Flash EEPROM device has been proposed that can be programmed at fast speeds (hundreds of nanoseconds) using low voltages for direct tunneling and storage of electrons in the silicon nanocrystals. By using nanocrystal charge storage sites that are isolated electrically, charge leakage through localized defects in the gate oxide layer is presumably reduced.

A germanium (Ge) nanocrystal Flash EEPROM device has also been demonstrated that can be programmed at low voltages and high speeds. Such a device was fabricated by implanting germanium atoms into a silicon substrate. However, the implantation process can cause germanium to locate at the silicon-tunnel oxide interface, forming trap sites that can degrade the device performance. The presence of such trap sites places a lower limit to the thickness of the resulting tunnel oxide, because defect-induced leakage current in a very thin tunnel oxide can result in poor data retention performance.

Solutions to these problems have been long sought, but have long eluded those skilled in the art.

DISCLOSURE OF THE INVENTION

The present invention provides a Flash memory having a trilayer structure of rapid thermal oxide (RTO)/germanium (Ge) nanocrystals in $SiO_2$/sputtered $SiO_2$ cap. This structure has been demonstrated with via capacitance versus voltage (C-V) measurements having memory hysteresis due to germanium nanocrystals in the middle layer of the trilayer structure. The Ge nanocrystals are synthesized by rapid thermal annealing (RTO) of co-sputtered Ge+$SiO_2$ films.

The present invention provides a method for obtaining a Flash memory structure of Ge nanocrystals synthesized by RTA technique and discloses that the Ge nanocrystal growth is critically dependent on the Ge concentration and the rapid thermal anneal RTA processing conditions.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
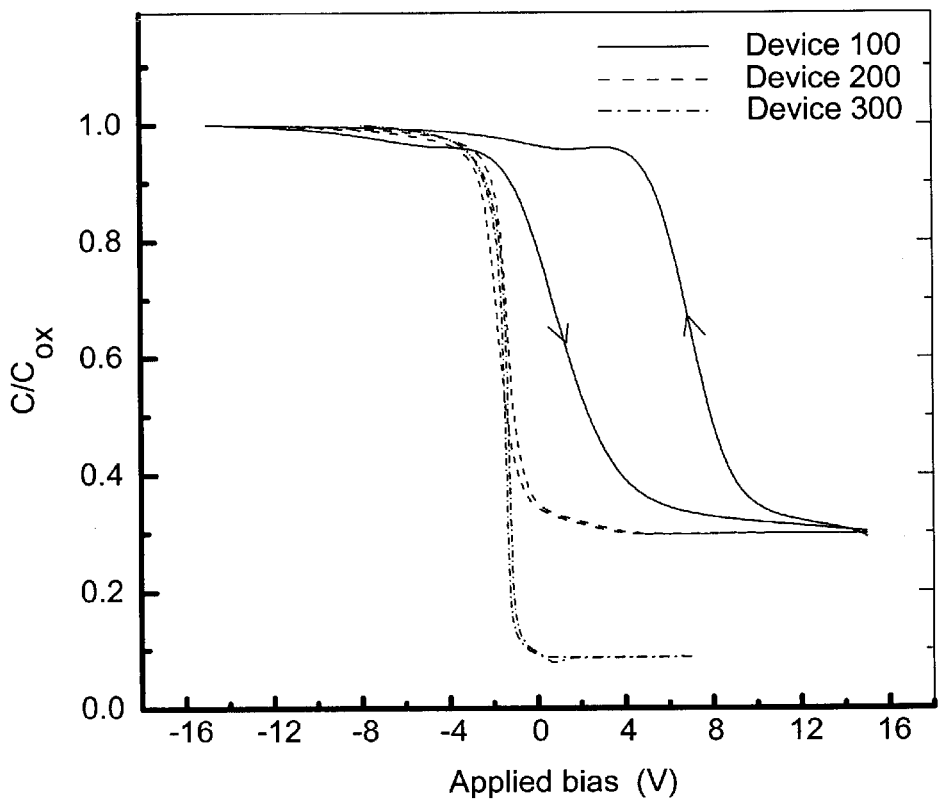
FIG. 1 is a chart of the capacitance versus voltage (C-V) characteristics of various multi-layer structure devices.

Referring now to FIG. 1, therein are shown capacitance versus voltage (C-V) curves of various experimental devices. The greater the hysteresis, or difference in capacitance upon application of a bias voltage and reversal of the bias voltage, the better the charge storage characteristics, or memory, of the device.

The capacitance versus voltage curves are shown for three devices: Devices 100, 200, 300. Each device includes a semiconductor substrate upon which a multi-layer insulator structure is formed where charges are to be stored. The Device 100 has a trilayer structure of RTO $SiO_2$(5 nm)/Ge+$SiO_2$(20 nm)/sputtered $SiO_2$(50 nm) cap, where the RTO is a rapid thermal oxide of silicon dioxide of 5 nm thickness, the Ge+$SiO_2$ is a combination of germanium and silicon dioxide of 50 nm thickness, and the sputtered silicon dioxide is of a 50 nm thickness. The Device 200 has a trilayer structure of RTO $SiO_2$(5 nm)/sputtered $SiO_2$(20 nm)/sputtered $SiO_2$(50 nm) cap. And the Device 300 has a two-layered structure of RTO $SiO_2$(5 nm)/Ge+$SiO_2$(20 nm).

The Device 100, which is a trilayer structure, exhibits a counter-clockwise hysteresis of about 6V in the C-V curve as shown in FIG. 1.

The Device 200, which is another trilayer structure with the middle insulator layer consisting of a 20-nm thick pure sputtered oxide, exhibits a counter-clockwise hysteresis about 0.73V. The width of this hysteresis is smaller than the width of the hysteresis of the Device 100.

Not shown is a similar trilayer structure as the Device 200, but omitting a rapid thermal anneal (RTA) step, which showed a hysteresis of 1.09V. This means that the RTA process improves the sputtered oxide quality and reduces the trapped charge density in the Device 200 from $3.62 \times 10^{11}$ cm$^{-2}$ (as-prepared) to $1.98 \times 10^{11}$ cm$^{-2}$ (after RTA). The pronounced hysteresis exhibited by the Device 100 must therefore be due to charge storage in the Ge nanocrystals located at the middle insulator layer. The existence of Ge nanocrystals in the middle layer will be discussed further in the TEM results to be presented later.

The Device 300, which is a two layer device, exhibits a small hysteresis of less than 0.5 volt. The smaller normalized minimum capacitance of the Device 300 is due to a thinner total oxide thickness of 25 nm. As there are fewer nanocrystals, it is reasonable to expect that the charge storage capacity will be less compared to the Device 100.

It has also been discovered that the sputtered SiO$_2$(50 nm) cap is important in promoting the Ge nanocrystal growth.

Figure 2:
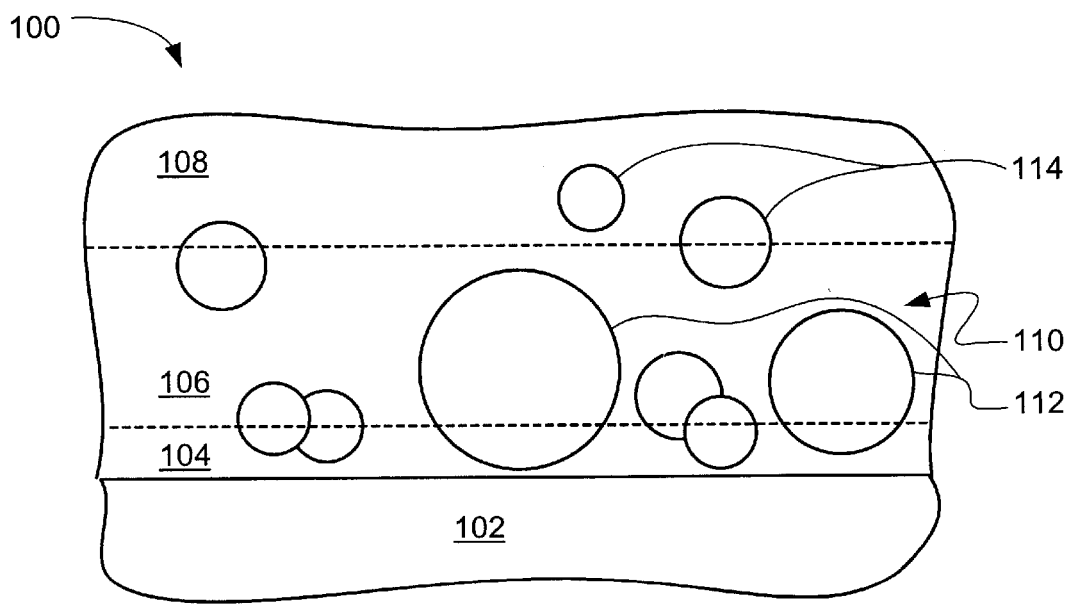
FIG. 2 is a diagram representative of a transmission electron microscope (TEM) micrograph of one of the devices of FIG. 1.

Referring now to FIG. 2, therein is shown a diagram representative of a transmission electron microscope (TEM) micrograph of the Device 100. FIG. 2 is a diagram of the trilayer structure after rapid thermal anneal at 1000° C. for 300 seconds. The trilayer structure of the Device 100 is formed on a semiconductor wafer such as a silicon substrate 102 and includes a first insulator layer 104 of 5 nm of RTO SiO$_2$, a nanocrystal-insulator layer 106 of 20 nm of co-sputtered Ge+SiO$_2$, and a second insulator layer 108 of 50 nm of pure sputtered SiO$_2$. The silicon substrate can be either n- or p-doped but is shown as being p-doped.

It can be seen from this diagram that the nanocrystal-insulator layer 106 consists of Ge nanocrystals 110 of different sizes. The trilayer structure of the Device 100 has been subjected to a rapid thermal anneal at 1000° C. for 300 seconds.

It should be noted that larger Ge nanocrystals 112 of diameter ($\delta$) ~20 nm were formed near the RTO SiO$_2$ to sputtered Ge+SiO$_2$ interface and smaller Ge nanocrystals 114 with $\delta$~6 nm are formed at the RTO SiO$_2$ to sputtered Ge+SiO$_2$ and the sputtered Ge+SiO$_2$ to pure sputtered SiO$_2$ interfaces. There seems to be more Ge nanocrystals 110 near the RTO SiO$_2$ to sputtered Ge+SiO$_2$ interface than the sputtered Ge+SiO$_2$ to pure sputtered SiO$_2$ interface. The central region of the nanocrystal-insulator layer 106 contains much fewer Ge nanocrystals 110.

At 1000° C., Ge can diffuse significantly in SiO$_2$. It is believed that as the concentration of Ge dissolved in SiO$_2$ is lower than the solubility at the Si to SiO$_2$ interface and higher at the bulk of the SiO$_2$, the concentration gradient can lead to a diffusion flux, resulting in an accumulation of Ge at the interface.

It has been discovered that when the Device 100 was annealed at 1000° C., significant Ge diffusion towards the two interfaces took place. The process can account for the larger number of Ge nanocrystals 110 near the two interfaces and the smaller number of Ge nanocrystals 110 in the central region of the nanocrystal-insulator layer 106. However, the reason is not known for the preferential formation of large Ge nanocrystals 112 and higher number of smaller Ge nanocrystals 114 at the RTO SiO$_2$ to sputtered Ge+SiO$_2$ interface.

It should be noted, referring back to FIG. 1, that the Device 100 also shows a significant positive shift of about 4V and a C-V curve with gentler slope as compared to the Device 200. As the hysteresis width is approximately 6V, this means that the Device 100 has a better charge storage capability than the Device 200. It has been suggested that in a system that contained Si—O—Si and Si—O—Ge bonds, the Ge—O bond is weaker and can be broken easily, leaving a Si—O— dangling bond structure. The 1000° C. annealed sample contained a substantial amount of GeO$_x$ bonds. This dangling bond structure can then trap an electron and become negatively charged. The significant positive shift of the C-V curve of the Device 100 may be due to the trapping of electrons by the dangling bonds. The gentler slope of the C-V curve of the Device 100 is a result of the large voltage shift induced by the charge stored in the nanocrystals. This was verified by C-V measurements at different delay times, i.e. to simulate different sweep rates.

Figure 3:
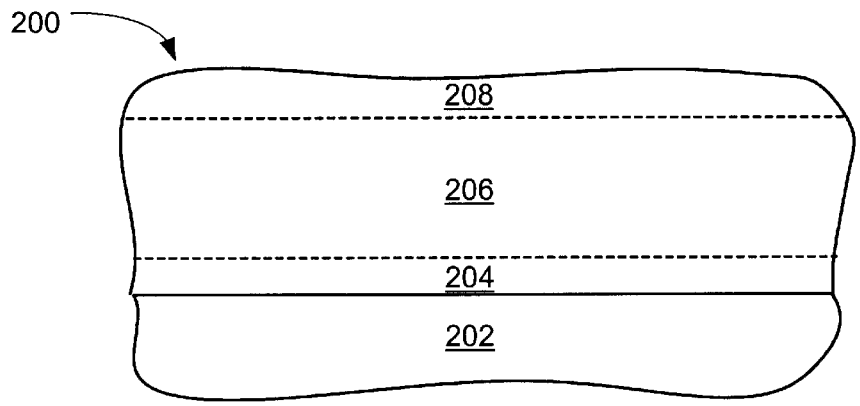
FIG. 3 is a diagram representative of a TEM micrograph of another of the devices of FIG. 1.

Referring now to FIG. 3, therein is shown a diagram representative of a TEM micrograph of the Device 200. The three-layer structure of the Device 200 is formed on a silicon substrate 202, which is p-doped, and includes a first insulator layer 204 of 5 nm of RTO SiO$_2$, a middle insulator layer of 20 nm of sputtered SiO$_2$, and a second insulator layer of 50 nm of sputtered SiO$_2$. This is a control device which has no Ge nanocrystals and which, as explained above, indicates that the high level of charge storage is due to the existence of Ge nanocrystals.

Figure 4:
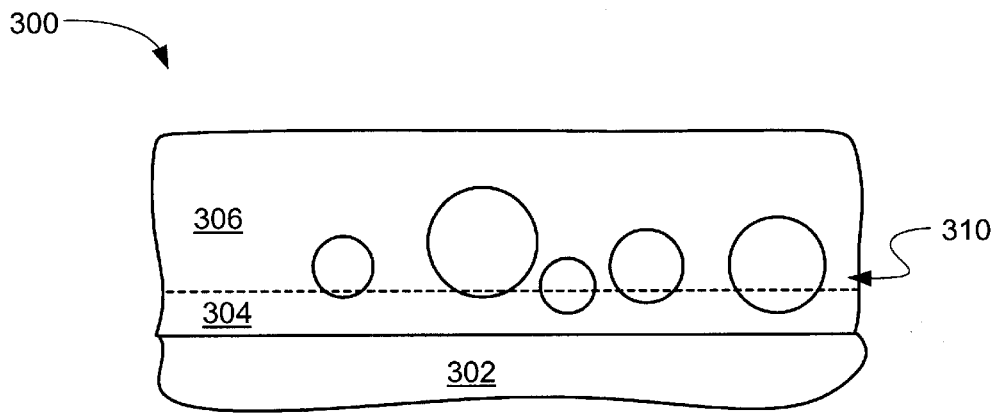
FIG. 4 is a schematic diagram of a nanocrystal Flash memory device according to the present invention.

Referring now to FIG. 4, therein is shown a diagram representative of a TEM micrograph of the Device 300. The two-layer structure of the Device 300 is formed on a silicon substrate 302, which is p-doped, and includes a first insulator layer 304 of 5 nm of RTO SiO$_2$ and a nanocrystal-insulator layer 306 of 20 nm of co-sputtered Ge+SiO$_2$.

The Device 300 was subjected to a RTA at 1000° C. for 300 seconds. It can be seen from FIG. 3 that Ge nanocrystals 310 are only located at the RTO SiO$_2$ to sputtered Ge+SiO$_2$ interface. As this device was fabricated without a capping oxide layer, it is reasonable to expect a significant out-diffusion of Ge to occur during RTA at 1000° C.

The C-V characteristic of the Device 300 as seen in FIG. 1 exhibits a small hysteresis of <0.5 V. The smaller normalized minimum capacitance of the Device 300 as compared to the other devices in FIG. 1 is due to a thinner total SiO$_2$ thickness (25 nm) in the Device 300. As the Ge nanocrystals are much lesser in number in the Device 300, it is reasonable to expect the charge storage capacity of this device to be lower as compared to the Device 100.

Figure 5:
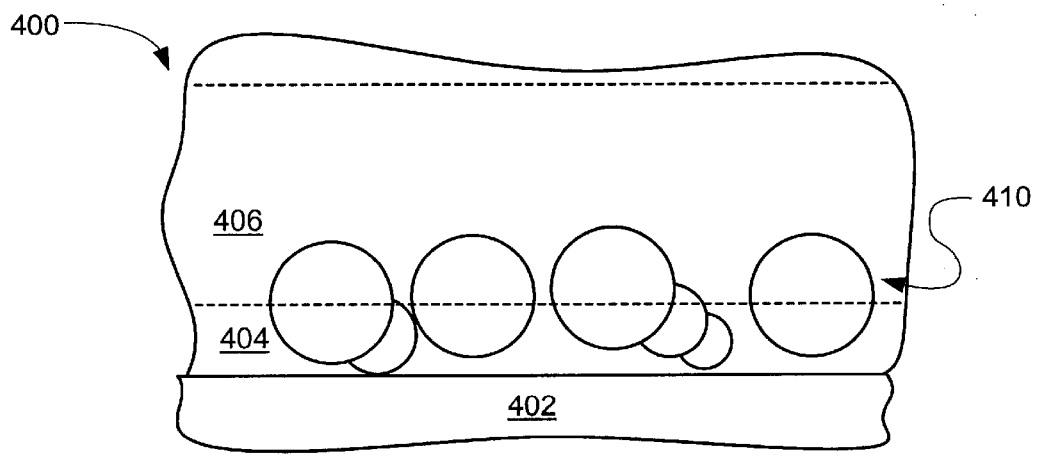
FIG. 5 is a diagram representative of a transmission electron micrograph of a TEM micrograph of the nanocrystal Flash memory device according to the present invention.

Referring now to FIG. 5, therein is shown a diagram representative of a transmission electron micrograph of a Device 400 having a substrate 402 and including a first insulator 404 and a nanocrystal-insulator layer 406 with Ge nanocrystals 410 formed at the RTO oxide/co-sputtered silicon oxide+Ge interface achieved under optimized fabrication conditions.

An example of the C-V curve of the Device 100 (not fully optimized) containing the various layers described above is shown in FIG. 1. This figure shows the charge storage capability of the proposed structure. It is to be noted that the range of gate voltages at depletion for the two logic states of the device can be further optimized by changing the thickness of the various layers of the Device 100.

Figure 6:
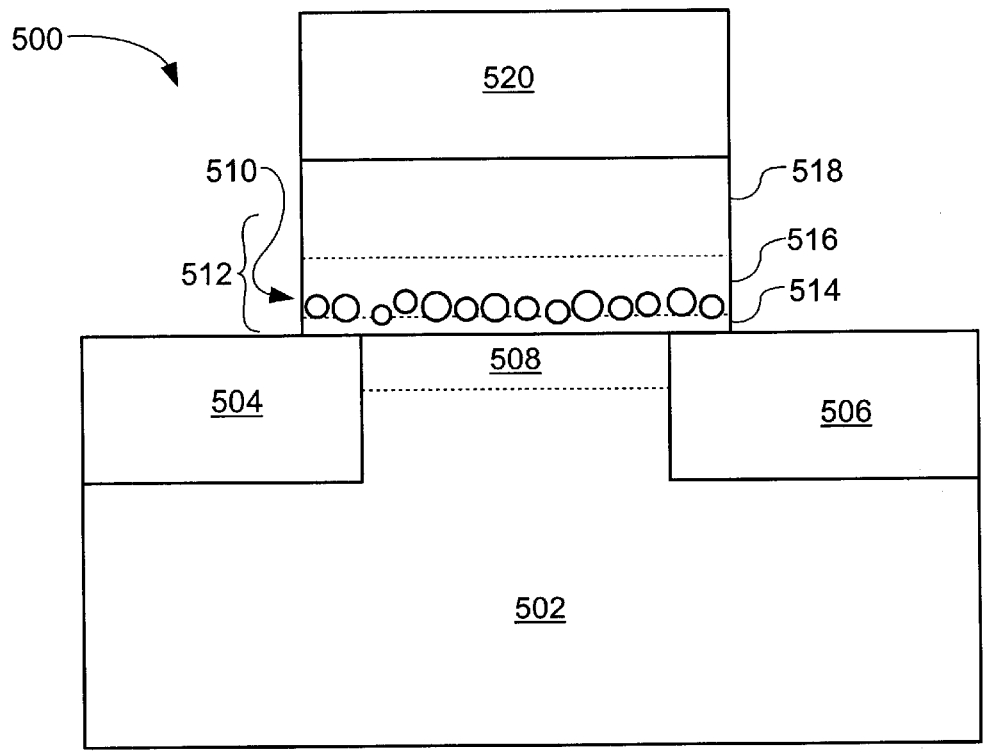
FIG. 6 is a Flash EEPROM device according to the present invention.

Referring now to FIG. 6, therein is shown an example of a Flash EEPROM device 500 according to the present invention, which has a metal-insulator-semiconductor (MIS) structure. A silicon substrate 502 has a source region 504 and a drain region 506 with a channel region 508 therebetween. In one embodiment, the silicon substrate 502 and channel region 508 are p-doped and the source and drain regions 504 and 506 are n-doped. A trilayer structure 512 consists of a first insulator layer, a nanocrystal-insulator layer, and a second insulator layer.

A thin (5 nm) SiO$_2$ first insulator layer 514 was grown on the p-type silicon substrate 502 in dry oxygen ambient using rapid thermal oxidation at about 1000° C.

A Ge+SiO$_2$ nanocrystal-insulator layer 516 of a thickness 20 nm was then deposited by the radio frequency (rf) co-sputtering technique. The sputtering target was a 4-inch SiO$_2$ (99.999% pure) disc with 6 pieces of undoped Ge (10 mm×10 mm×0.3 mm) attached. The argon pressure and rf power were fixed at 3×10$^{-3}$ mbar and 100 W, respectively.

A pure SiO$_2$ second insulator layer 518 (50 nm) was then deposited by rf sputtering in argon at a rf power of 100W and sputtering pressure at 3×10$^{-3}$ mbar.

The trilayer structure 512 was then rapid thermal annealed (RTA) in argon ambient at a temperature of 1000° C. for 300 s to form the nanocrystals 510. The RTA ramp-up and ramp-down rates were fixed at about 30° C./second.

The polysilicon control gate 520 was formed over the SiO$_2$ layer 518.

The present invention uses rf co-sputtering to form the germanium nanocrystal-insulator layer 106. Since a high-quality SiO$_2$ layer 514, which is a thin tunnel oxide, can be grown by rapid-thermal oxidation prior to the sputtering process, the silicon to oxide interface of the first insulator layer 104 can be of a very good quality as ion-implantation damage is non-existent. The first insulator layer 104 also serves as a barrier to "line up" the Ge nanocrystals 510 at the oxide-sputtered layer interface during high-temperature rapid thermal annealing of the oxide-sputtered layer.

The structure consists of a rapid thermal oxide layer/SiO$_2$ layer with a Ge nanocrystals/sputtered silicon oxide cap layer. The Ge nanocrystals are responsible for the charge storage. In order for the proposed device to function well as a low-voltage high-speed Flash memory device (i.e., to have low write and erase voltages and short write and erase pulse duration), the Ge nanocrystals must lie as close to the Si substrate as possible (i.e., located at the RTO oxide/sputtered SiO$_2$+Ge layer interface).

The fabrication process steps of the proposed device are as follows:

(1) A good quality thin (about 2–5 nm) thermal oxide is grown on Si wafer by rapid thermal oxidation in a dry oxygen ambient.

(2) A layer of silicon oxide film that contains Ge nanocrystals is deposited. This layer is first deposited by co-sputtering silicon dioxide and Ge targets to obtain a germanium-silicon-oxide layer with a thickness of about 3 to 20 nm. The Ge concentration in the matrix can be varied from about 1 to 5 atomic percentage (at. %). The sputtering conditions are about: a sputtering pressure of 5 mTorr of argon (Ar) and a radio frequency (rf) power of 100W. The nanocrystal formation will be carried out after step (5) is completed.

(3) A layer of silicon oxide of about 20 nm is deposited by rf sputtering of a pure silicon dioxide target at 5 mTorr at 100W.

(4) The structure, consisting of 3 layers, is rapid thermal annealed at about 800–1000° C. for about 50 to 300 seconds in Ar.

It is to be noted that the distribution and size of the Ge nanocrystals are critically dependent on:

(1) The thickness of the rapid thermal oxide layer.
(2) The deposition of the Ge+SiO$_2$ layer.
(3) The Ge concentration, the RTA temperature and duration.
(4) The thickness of the third sputtered oxide layer or sputtered SiO$_2$ cap.

Figure 7:
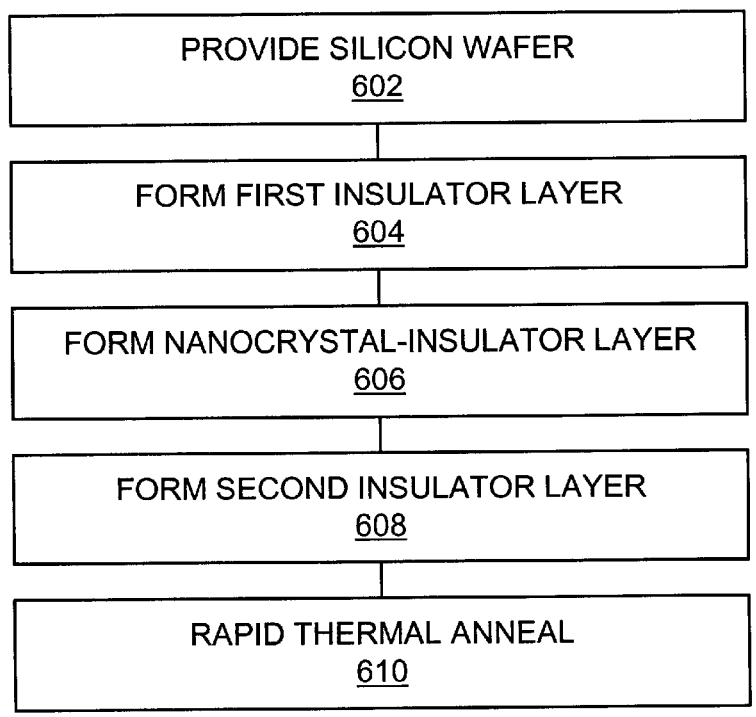
FIG. 7 is a simplified flow chart according to the present invention.

Referring now to FIG. 7, therein is shown a simplified flow chart 600 of the manufacturing method of the present invention. The method starts with Provide Silicon Wafer 602, which proceeds to Form First Insulator Layer 604, Form Nanocrystal-Insulator Layer 606, and Form Second Insulator Layer 608. After the layers are formed, the method proceeds to Rapid Thermal Anneal 610. Subsequently, other steps are used to finish the Flash EEPROM device as well known to those having ordinary skill in the art.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for manufacturing a Flash memory device comprising:

providing a semiconductor wafer;

forming a first insulator layer over the semiconductor wafer;

forming a nanocrystal-insulator layer over the first insulator layer, the forming the nanocrystal-insulator layer uses from 1 to 5 atomic percentage of nanocrystal material;

forming a second insulator layer over the nanocrystal-insulator layer; and rapid thermal annealing the first insulator layer, the nanocrystal-insulator layer, and the second insulator layer.

2. The method as claimed in claim 1 wherein:

forming the nanocrystal-insulator layer is performed by co-sputtering nanocrystal material and insulator material.

3. The method as claimed in claim 1 wherein:

forming the second insulator layer uses a sputtering process.

4. The method as claimed in claim 1 wherein:

forming the first insulator layer uses a rapid thermal process.

5. A method for manufacturing a Flash memory device comprising:

providing a semiconductor wafer;

forming a first insulator layer over the semiconductor wafer;

forming a nanocrystal-insulator layer over the first insulator layer;

forming a second insulator layer over the nanocrystal-insulator layer; and rapid thermal annealing the first insulator layer, the nanocrystal-insulator layer, and the second insulator layer to provide more nanocrystals proximate the first insulator layer to nanocrystal-insulator layer than proximate the nanocrystal-insulator layer to the second insulator layer.

6. The method as claimed in claim 5 wherein:

forming the nanocrystal-insulator layer is performed by co-sputtering nanocrystal material and insulator material.

7. The method as claimed in claim 5 wherein:

forming the second insulator layer uses a sputtering process.

8. The method as claimed in claim 5 wherein: forming the first insulator layer uses a rapid thermal process.

9. A method for manufacturing a Flash memory device comprising:

providing a semiconductor wafer;

forming a first oxide layer over the semiconductor wafer;

forming a germanium nanocrystal-oxide layer over the first oxide layer, the forming the germanium nanocrystal-oxide layer uses from about 1 to 5 atomic percentage of germanium material;

forming a second oxide layer over the germaniun-oxide layer; and rapid thermal annealing the first oxide layer, the germanium crystal-oxide layer, and the second oxide layer.

10. The method as claimed in claim 9 wherein:

forming the germanium nanocrystal-oxide layer is performed by co-sputtering germanium material and oxide material.

11. The method as claimed in claim 9 wherein:

forming the germanium nanocrystal-oxide layer includes forming germanium nanocrystals by the rapid thermal annealing.

12. The method as claimed in claim 9 wherein:

forming the first oxide layer uses a rapid thermal oxidation process.

13. The method as claimed in claim 9 wherein:

forming the germanium nanocrystal-oxide layer is performed by radio frequency co-sputtering germanium material and oxide material in an inert ambient.

14. The method as claimed in claim 9 wherein:

forming the second oxide layer uses a radio frequency sputtering process in an inert ambient.

15. The method as claimed in claim 9 wherein:

rapid thermal annealing at about 800–1000° C. for about 50 to 300s in an inert ambient for the first oxide layer, the germanium nanocrystal-oxide layer, and the second oxide layer to provide more germanium nanocrystals proximate the first oxide layer to germanium nanocrystal-oxide layer than proximate the germanium nanocrystal-oxide layer to the second oxide layer.

16. The method as claimed in claim 9 wherein:

rapid thermal annealing ramp-up and ramp-down rates were fixed at about 30° C./second for the first oxide layer, the germanium nanoncrystal-oxide layer, and the second oxide layer to provide more germanium nanocrystals proximate the first oxide layer to germanium nanocrystal-oxide layer than proximate the germanium nanocrystal-oxide layer to the second oxide layer.

17. The method as claimed in claim 9 wherein:

implanting sources in the silicon wafer;

implanting drains in the silicon wafer separated from the sources by channels; and forming gates over the channels.

18. A method for manufacturing a Flash memory device comprising:

providing a semiconductor wafer;

forming a first oxide layer over the semiconductor wafer;

forming a germanium nanocrystal-oxide layer over the first oxide layer;

forming a second oxide layer over the germanium-oxide layer; and rapid thermal annealing the first oxide layer, the germanium-oxide layer, and the second oxide layer to provide more germanium nanocrystals proximate the first oxide layer to germanium nanocrystal-oxide layer than proximate the germanium nanocrystal-oxide layer to the second oxide layer.

19. The method as claimed in claim 18 wherein:

forming the germanium nanocrystal-oxide layer is performed by radio frequency co-sputtering germanium material and oxide material in an inert ambient.

20. The method as claimed in claim 18 wherein:

forming the second oxide layer uses a radio frequency sputtering process in an inert ambient.

21. The method as claimed in claim 18 wherein:

forming the first oxide layer uses a rapid thermal oxidation process at about 1000° C. in a dry oxygen ambient.

22. The method as claimed in claim 18 wherein:

rapid thermal annealing at about 800–1000° C. for about 50 to 300 s in an inert ambient for the first oxide layer, the germanium nanocrystal-oxide layer, and the second oxide layer to provide more germanium nanocrystals proximate the first oxide layer to germanium nanocrystal-oxide layer than proximate the germanium nanocrystal-oxide layer to the second oxide layer.

23. The method as claimed in claim 18 wherein:

rapid thermal annealing ramp-up and ramp-down rates were fixed at about 30° C./second for the first oxide layer, the germanium nanocrystal-oxide layer, and the second oxide layer to provide more germanium nanocrystals proximate the first oxide layer to germanium nanocrystal-oxide layer than proximate the germanium nanocrystal-oxide layer to the second oxide layer.

24. The method as claimed in claim 18 including:

implanting sources in the silicon wafer;

implanting drains in the silicon wafer separated from the sources by channels; and forming gates over the channels.

25. A Flash device comprising:

a semiconductor substrate;

a first insulator layer formed over the semiconductor substrate;

a nanocrystal-insulator layer formed over the first insulator layer, the nanocrystal-insulator layer contains from 1 to 5 atomic percentage of nanocrystal material;

a second insulator layer formed over the nanocrystal-insulator layer; and nanocrystals proximate the first insulator layer and the nanocrystal-insulator layer.

26. The device as claimed in claim 25 including:

sources implanted in the semiconductor substrate;

drains implanted in the semiconductor substrate separated from the sources by channels; and gates formed over the channels.

27. The device as claimed in claim 25 including:

sources implanted in the semiconductor substrate;

drains implanted in the semiconductor substrate separated from the sources by channels; and gates formed over the channels.

28. A Flash device comprising:

a semiconductor substrate;

a first insulator layer formed over the semiconductor substrate;

a nanocrystal-insulator layer formed over the first insulator layer;

a second insulator layer formed over the nanocrystal-insulator layer; and nanocrystals proximate the first insulator layer and the nanocrystal-insulator layer wherein more nanocrystals are proximate the first insulator layer to nanocrystal-insulator layer than proximate the nanocrystal-insulator layer to the second insulator layer.

29. The device as claimed in claim 28 including:

sources implanted in the semiconductor substrate;

drains implanted in the semiconductor substrate separated from the sources by channels; and gates formed over the channels.

30. A Flash device comprising:

a silicon substrate;

a first oxide layer formed over the silicon substrate;

a germanium nanocrystal-oxide layer formed over the first oxide layer, the germanium nanocrystal-oxide layer contains from about 1 to 5 atomic percentage of germanium material;

a second oxide layer formed over the germanium nanocrystal-oxide layer; and germanium nanocrystals proximate the first oxide layer, the germanium nanocrystal-oxide layer, and the second oxide layer.

31. A Flash device comprising:

a silicon substrate;

a first oxide layer formed over the silicon substrate;

a germanium nanocrystal-oxide layer formed over the first oxide layer;

a second oxide layer formed over the germanium nanocrystal-oxide layer; and germanium nanocrystals proximate the first oxide layer, the germanium nanocrystal-oxide layer, and the second oxide layer wherein more germanium nanocrystals are proximate the first oxide layer to germanium nanocrystal-oxide layer than proximate the germanium nanocrystal-oxide layer to the second oxide layer.

32. The device as claimed in claim 31 including:

doped sources implanted in the silicon substrate;

doped drains implanted in the silicon separated from the doped sources by channels; and polysilicon gates formed over the channels.

\* \* \* \* \*